United States Patent
Yu

(10) Patent No.: US 8,765,333 B2
(45) Date of Patent: Jul. 1, 2014

(54) COLOR FILTER ARRAY HAVING HYBRID COLOR FILTERS AND MANUFACTURING METHOD THEREOF

(75) Inventor: Cheng-Hung Yu, Taoyuan County (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 148 days.

(21) Appl. No.: 13/561,103

(22) Filed: Jul. 30, 2012

(65) Prior Publication Data

US 2014/0027682 A1   Jan. 30, 2014

(51) Int. Cl.
*G02B 5/20* (2006.01)
*G03F 7/20* (2006.01)

(52) U.S. Cl.
USPC .............................................. 430/7

(58) Field of Classification Search
None
See application file for complete search history.

(56) References Cited

U.S. PATENT DOCUMENTS

| | | |
|---|---|---|
| 3,971,065 A | 7/1976 | Bayer |
| 6,950,140 B2 | 9/2005 | Fukuyoshi et al. |
| 7,708,686 B2 | 5/2010 | Venkataraman |
| 2008/0112069 A1* | 5/2008 | Helber et al. ............... 359/891 |
| 2009/0091644 A1 | 4/2009 | Mackey |

* cited by examiner

*Primary Examiner* — John A. McPherson
(74) *Attorney, Agent, or Firm* — Winston Hsu; Scott Margo

(57) ABSTRACT

A method for manufacturing a color filter array having hybrid color filters includes providing a high-grade photoresist and a low-grade photoresist, forming a plurality of first color filters on a substrate, and forming a plurality of second color filters and a plurality of third color filters on the substrate. The first color filters include the high-grade photoresist, and the second color filters and the third color filters include the low-grade photoresist. The high-grade photoresist of the first color filters includes a first amount of large size pigments in one unit area and the low-grade photoresists of the second color filters and the third color filters include a second amount of large size pigments in one unit area. A ratio of the second amount to the first amount is equal to or larger than 1.

20 Claims, 4 Drawing Sheets

COLOR FILTER ARRAY HAVING HYBRID COLOR FILTERS AND MANUFACTURING METHOD THEREOF

BACKGROUND OF THE INVENTION

1. Field of the Invention

The invention relates to a color filter array (hereinafter abbreviated as CFA) having hybrid color filters and manufacturing method thereof, and more particularly, to a Bayer pattern CFA having hybrid color filters and manufacturing method thereof.

2. Description of the Prior Art

As the development of digital cameras, scanners, and other electronic products progresses, the demand for semiconductor image sensor devices is increased accordingly. In state-of-the-art, image sensor devices in common usage can be categorized into charge-coupled devices (CCD) image sensor and complementary metal-oxide-semiconductor image sensor (CMOS image sensor, CIS). Primarily, CIS is prevalently use due to its advantages of low operating voltage, low power consumption, high operating efficiency, and ability for random access. Moreover, CIS is capable of integration with the semiconductor fabrication process.

One of the essential elements for the semiconductor image sensor device is the CFA for filtering lights so that lights in the red, green and blue wavelengths are transmitted to different pixels. Please refer to FIG. 1, which is schematic drawing illustrating a conventional CFA. In the prior art, the color filters in a CFA are often arranged to form a matrix, such as a Bayer pattern CFA. According to the Bayer pattern CFA 10 as shown in FIG. 1, the odd-rows 12 include the green color filters G and the blue color filters B alternately arranged while the even-rows 14 include the green color filters G and the red color filters R alternately arranged. The need for having twice as many green color filters G as either red or blue color filters R/B is because the human eye is more sensitive to green light than to the other two colors of light. Thus, color accuracy of green color filters G is more important.

SUMMARY OF THE INVENTION

According to an aspect of the present invention, a method for manufacturing a CFA is provided. The method includes providing a high-grade photoresist and a low-grade photoresist, forming a plurality of first color filters having the high-grade photoresist on substrate, and forming a plurality of second color filters and a plurality of third color filters having the low-grade photoresist on the substrate. The high-grade photoresist of the first color filters includes a first amount of large size pigments in one unit area while the low-grade photoresists of the second color filters and the third color filters include a second amount of large size pigments in one unit area. A ratio of the second amount to the first amount is equal to or larger than 1.

According to another aspect of the present invention, a CFA having hybrid color filters is provided. The CFA includes a plurality of green color filters having a high-grade photoresist, a plurality of blue color filters having a low-grade photoresist, and a plurality of red color filters having the low-grade photoresist. The high-grade photoresist includes a first amount of large size pigments in one unit area while the low-grade photoresists include a second amount of large size pigments in one unit area. A ratio of the second amount to the first amount is equal to or larger than 1.

According to the CFA having hybrid color filters and manufacturing method provided by the present invention, the green color filters to which the human eye is more sensitive include the high-grade photoresist while the blue color filters and the red color filters to which the human eye is less sensitive include the low-grade photoresist. Accordingly, the CFA performance is improved without increasing process cost.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 3-4 are schematic drawings illustrating the method for manufacturing the CFA provided by the preferred embodiment of the present invention, wherein FIG. 4 is a schematic drawing in a step subsequent to FIG. 3.

DETAILED DESCRIPTION

Figure 1:
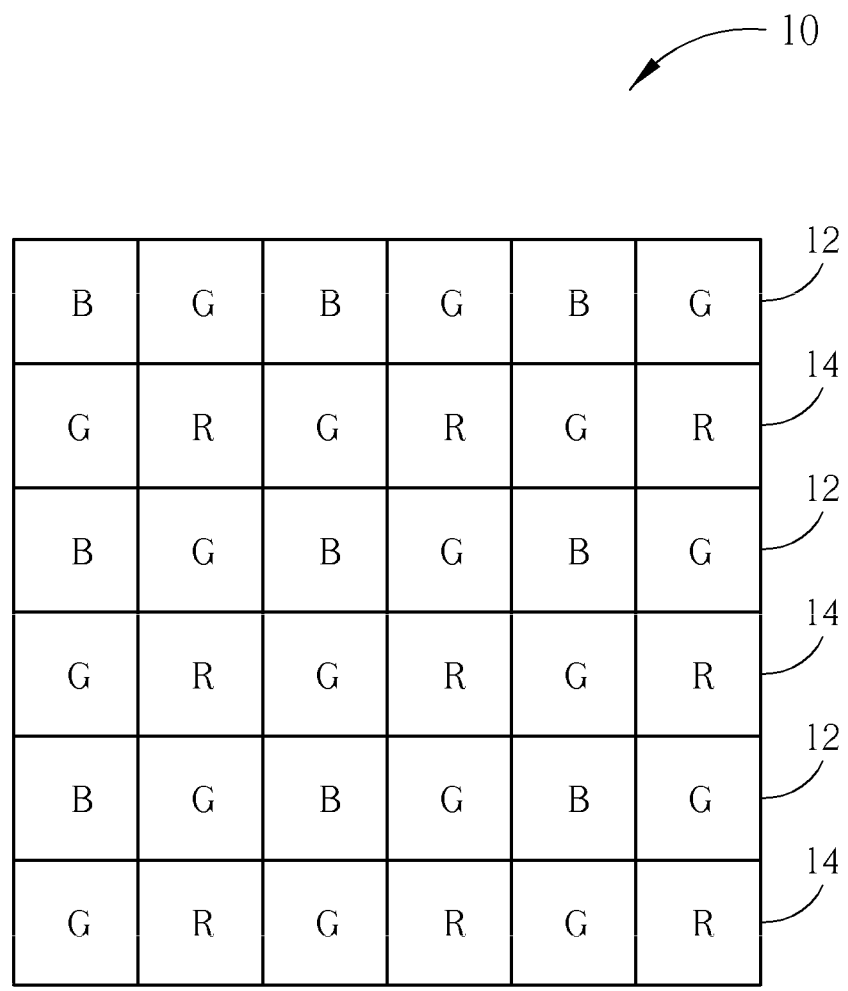
FIG. 1 is schematic drawing illustrating a conventional CFA.

Please refer to Table 1, which compares amounts of large size pigments in one unit area between photoresists of different grades:

TABLE 1

|  | Red | Green | Blue |
|---|---|---|---|
| Third grade photoresist | 173 | 404 | 373 |
| Second grade photoresist | 2 | 8 | 3 |
| First grade photoresist | 1 | 2 | 1 |

It is noteworthy that the amount of large size pigments in one unit area means the amount of pigments having a diameter of 0.5 micrometer ($\mu m$) in 1 millimeter square ($mm^2$). It is well-known to those skilled in the art that that the larger the amount of large size pigments in one unit area is, the easier the black defect are found in the photoresist. In other words, photoresist of higher grade includes lower amount of large size pigments in one unit area. As shown in Table 1, the photoresist of the same grade includes the green color, the blue color, and the red color. It is noteworthy that in the same grade, the green color photoresist includes the amount of large size pigments in one unit area larger than the blue color photoresist and the red color photoresist. In the first grade photoresist, for example, an amount of large size pigments in one unit area in the green color photoresist is 2, an amount of large size pigments in one unit area in the blue color photoresist is 1, and an amount of large size pigments in one unit area in the red color photoresist is 1. In other words, a ratio of the amounts of large size pigments in one unit area in the first grade blue color photoresist and in the first grade red color photoresist to the amount of large size pigments in one unit area in the first grade green color photoresist is smaller than 1. Such characteristic is found in the photoresist of every grade. Accordingly, it is conceivable that in photoresists of the same grade, the ratio of the amounts of large size pigments in one unit area in the blue color photoresist and in the red color photoresist to the amount of large size pigments in one unit area in the green color photoresist is always smaller than 1.

However, such characteristic is not found in photoresists of different grades. For example, an amount of large size pigments in one unit area in the first grade green color photoresist is 2, an amount of large size pigments in one unit area in the second grade red color photoresist is 2, and an amount of large size pigments in one unit area in the second grade blue color photoresist is 3. Consequently, a ratio of the amount of large size pigments in one unit area in the second grade red color photoresist to the amount of large size pigments in one unit area in the first grade green color photoresist is equal to 1 while a ratio of the amount of large size pigments in one unit area in the second grade blue color photoresist to the amount of large size pigments in one unit area in the first grade green color photoresist is larger than 1. Accordingly, it is conceivable that in photoresists of different grades, the ratio of the amounts of large size pigments in one unit area in the blue color photoresist and in the red color photoresist to the amount of large size pigments in one unit area in the green color photoresist is always equal to or larger than 1.

Figure 2:
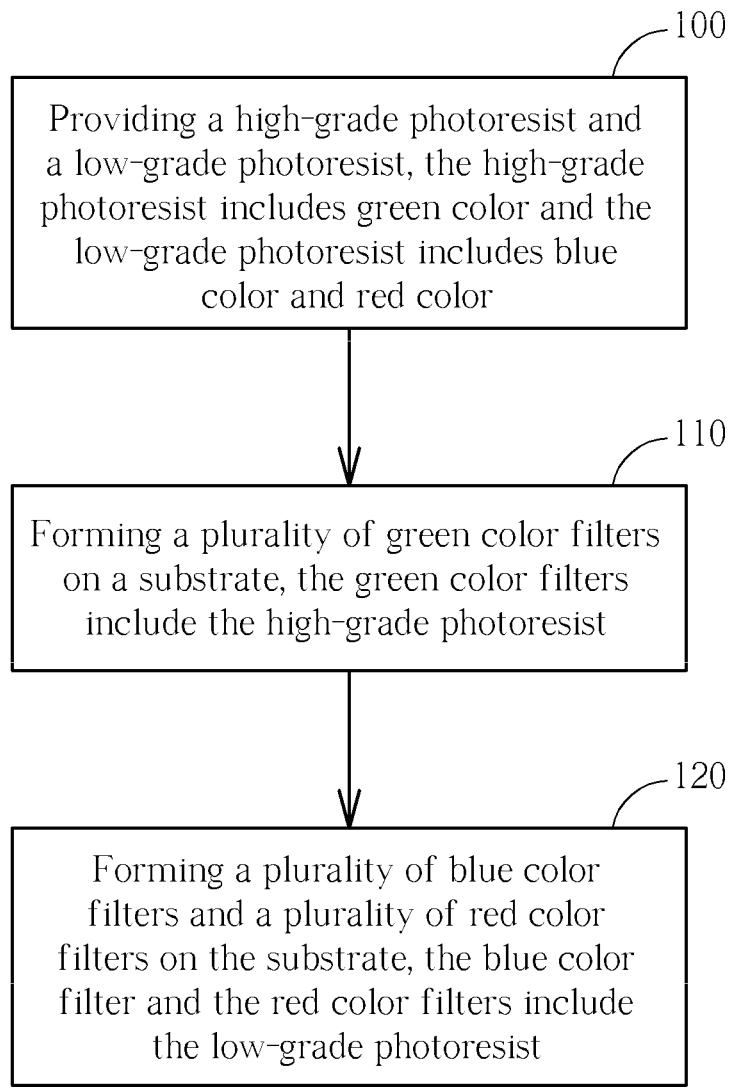
FIG. 2 is a flow chart for a method for manufacturing a CFA provided by a preferred embodiment of the present invention.
Figure 3:
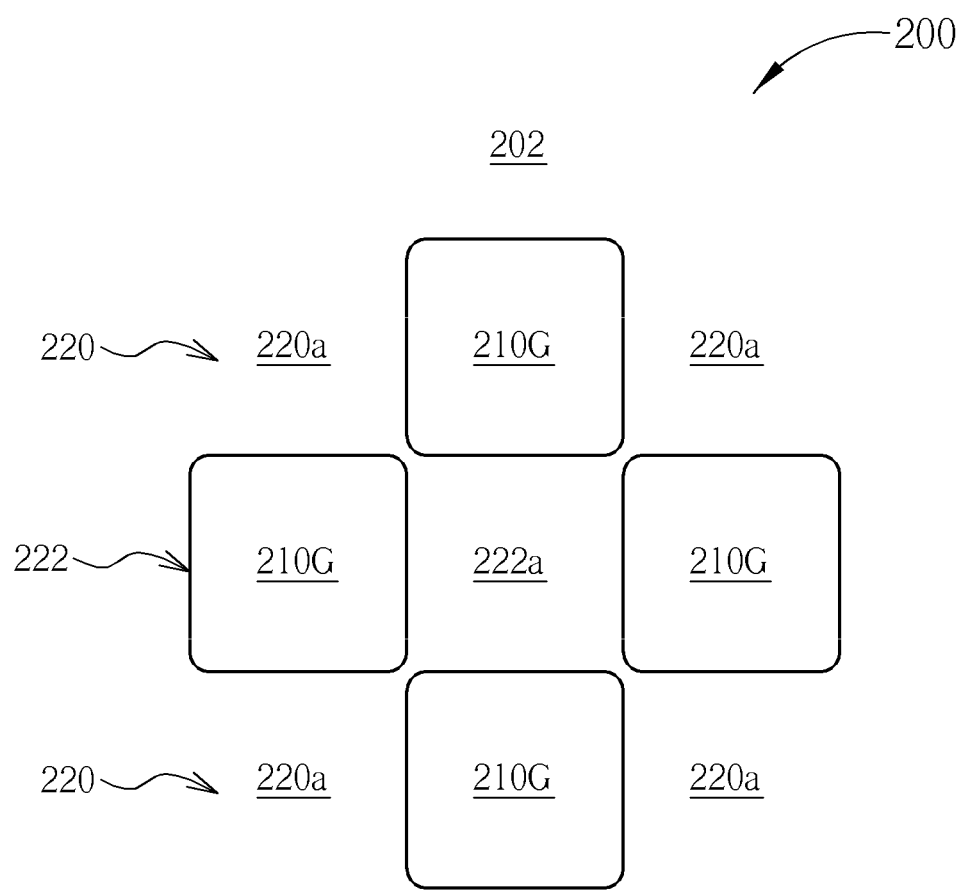
Figure 4:
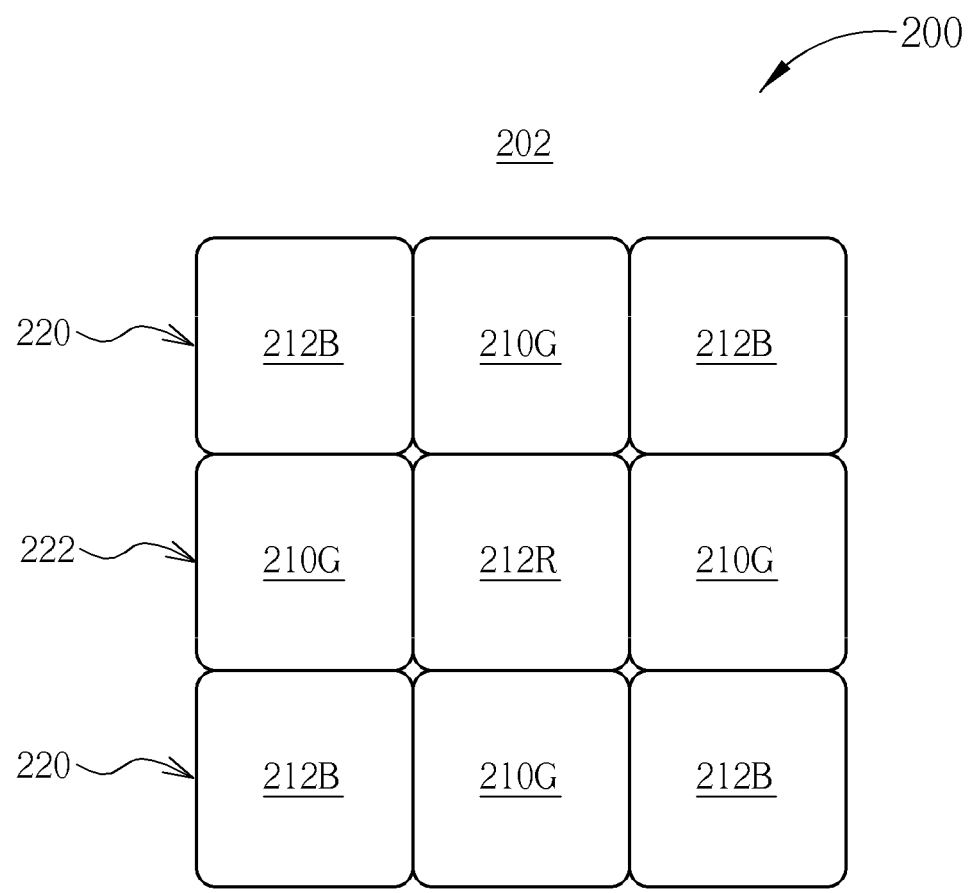

Please refer to FIGS. 2-4, wherein FIG. 2 is a flow chart for a method for manufacturing a CFA provided by a preferred embodiment of the present invention, and FIGS. 3-4 are schematic drawings illustrating the method for manufacturing the CFA provided by the preferred embodiment of the present invention. As shown in FIG. 2, a Step 100 is performed:

Step 100: Providing a high-grade photoresist and a low-grade photoresist, the high-grade photoresist includes a green color and the low-grade photoresist includes a blue color and a red color It is noteworthy that the high-grade photoresist and the low-grade photoresist provided by the preferred embodiment are photoresists of different grades. For example, when the high-grade photoresist provided by the preferred embodiment is the first grade photoresist in Table 1, the low-grade photoresist provided by the preferred embodiment can be the second grade photoresist or the third grade photoresist in Table 1. In the same concept, when the high-grade photoresist provided by the preferred embodiment is the second grade photoresist in Table 1, the low-grade photoresist provided by the preferred embodiment can be the third grade photoresist in Table 1. Briefly speaking, the high-grade photoresist and the low-grade photoresist are differed by at least one grade.

Please refer to FIG. 2 and FIG. 3:

Step 110: Forming a plurality of green color filters on a substrate, the green color filters include the high-grade photoresist.

As shown in FIG. 3, a plurality of green color filters 210G is formed on a substrate 202 according to the preferred embodiment. The substrate 202 typically includes a silicon substrate having an array of semiconductor image sensor devices (not shown) formed thereon. The semiconductor image sensor devices include CIS, CCD image sensor devices or any other image sensor known in the art. Additionally, elements required by the product such as dielectric layer, metal interconnections and light-shielding layers are well-known to those skilled in the art and thus those elements and fabricating processes thereof are omitted herein in the interest of brevity. As shown in FIG. 3, the green color filters 210G include the high-grade photoresist. The green color filters 210G are arranged to form a checker board pattern having a plurality of rows. In detail, the checker board pattern includes a plurality of first rows 220 and a plurality of second rows 222, and the first rows 220 and the second rows 222 are alternately arranged. Each of the first rows 220 includes a plurality of gaps 220a formed therein and each of the second rows 222 includes a plurality of gaps 222a formed therein. As shown in FIG. 3, the green color filter 210G are positioned in diagonal arrangement. Also, the gaps 220a and the gaps 222a are positioned in diagonal arrangement. Consequently, each of the green color filters 210G is always adjacent to the gaps 220a/222a. As mentioned above, since the human eye is more sensitive to the green color, the amount of the green color filters 210G is larger than the other two colors according to the preferred embodiment. More important, the green color filters 210G include the high-grade photoresist in the preferred embodiment. In other words, the high-grade photoresist is utilized to form the green color filters 210G which require higher color accuracy, and the green color filters 210G are formed on the substrate 202 for serving as a framework for a Bayer pattern CFA (shown in FIG. 4).

Please refer to FIG. 2 and FIG. 4:

Step 120: Forming a plurality of blue color filters and a plurality of red color filters on the substrate, the blue color filter and the red color filters include the low-grade photoresist As shown in FIG. 4, the blue color filters 212B and the red color filters 212R are formed on the substrate 202. It is well-known to those skilled in the art that the blue color filters 212B and the red color filters 212R are sequentially formed on the substrate 202. However the process order for forming the blue color filters 212B and the red color filters 212R is not limited. More important, the blue color filters 212B and the red color filters 212R are respectively formed in the adjacent rows 220/222. In detail, the blue color filters 212B are formed in the gaps 220a in each first row 220 while the red color filters 212R are formed in the gaps 222a in each second row 222. Accordingly, the green color filters 210G and the blue color filters 212B are alternately arranged in each first row 220 while the green color filters 210G and the red color filters 212R are alternately arranged in each second row 222. By filling the gaps 220a/222a in the checker board pattern, which is formed by the green color filters 210G, with the blue color filters 212B and the red color filters 212R, a Bayer pattern CFA 200 composed of the green color filters 210G, the blue color filters 212B, and the red color filters 212R is obtained according to the preferred embodiment. Since the human eye is less sensitive to the blue color and the red color, the amounts of the blue color filters 212B and the red color filters 212R are smaller than the amount of the green color filters 210G. More important, the blue color filters 212B and the red color filters 212R include the low-grade photoresist according to the preferred embodiment. Additionally, the blue color filters 212B and the red color filters 212R can include the photoresist of the same grade, but the blue color filters 212B and the red color filters 212R can also include photoresist of different grade as long as the grades of those photoresists are both lower than the photoresist used to form the green color filters 210G.

Accordingly, the Bayer pattern CFA 200 provided by the preferred embodiment includes the hybrid color filters. It is noteworthy that by mentioning the hybrid color filters, the present invention emphasizes the color filters are formed by photoresists of different grades. As mentioned above, the green color filters 210G include the high-grade photoresist while the blue color filters 212B and the red color filters 212R include the low-grade photoresist. Therefore, an amount of large size pigments in one unit area in the green color filters 210G is less than amounts of large size pigments in one unit area in the blue color filters 212B and in the red color filters 212R. More particularly, a ratio of the amount of large size pigments in one unit area in the blue color filters 212B and in the red color filters 212R to the amount of large size pigments in one unit area in the green color filters 210G is equal to or larger than 1.

For example, when the green color filters 210G include the first grade photoresist in Table 1; the amount of large size pigments in one unit area is 2. When the blue color filters 212B and the red color filters 212R include the second grade photoresist in Table 1, an amount of large size pigments in one unit area in the blue color filters 212B is 3 and an amount of large size pigments in one unit area in the red color filters 212R is 2. Therefore, the ratio of the amount of large size pigments in one unit area in the blue color filters 212B to the amount of large size pigments in one unit area in the green color filters 210G is 1.5 while the ratio of the amount of large size pigments in one unit area in the red color filters 212R to the amount of large size pigments in one unit area in the green color filters 210G is 1. In the same concept, when the green color filters 210G in the preferred embodiment include the first grade photoresist in Table 1, an amount of large size pigments in one unit area is 2. When the blue color filters 212B and the red color filters 212R in the preferred embodiment include the third grade photoresist in Table 1, an amount of large size pigments in one unit area in the blue color filters 212B is 373 and an amount of large size pigments in one unit area in the red color filters 212R is 173. Accordingly, the ratio of the amount of large size pigments in one unit area in the blue color filters 212B to the amount of large size pigments in one unit area in the green color filters 210G is 186.5 while the ratio of the amount of large size pigments in one unit area in the red color filters 212R to the amount of large size pigments in one unit area in the green color filters 210G is 86.5. According to another example in the preferred embodiment, when the green color filters 210G include the second grade photoresist in Table 1, and the blue color filters 212B and the red color filters 212R include the third grade photoresist in Table 1, an amount of large size pigments in one unit area in the green color filters 210G is 8, an amount of large size pigments in one unit area in the blue color filters 212B is 373, and an amount of large size pigments in one unit area in the red color filters 212R is 173. Accordingly, the ratio of the amount of large size pigments in one unit area in the blue color filters 212B to the amount of large size pigments in one unit area in the green color filters 210G is 46.625 while the ratio of the amount of large size pigments in one unit area in the red color filters 212R to the amount of large size pigments in one unit area in the green color filters 210G is 21.625. In summary, the ratio of the amounts of large size pigments in one unit area in the blue color filters 212B and in the red color filters 212R to the amount of large size pigments in one unit area in the green color filters 210G is always equal to or larger than 1 according to the preferred embodiment.

It is well-known in state-of-the-art that the products having higher requirement of image sensing performance includes CFA formed by photoresists of the same one high grade while the products having lower requirement of image sensing performance includes CFA formed by photoresists of the same one low grade. Different from the prior art, the CFA provided by the present invention includes the high-grade photoresist for forming the green color filters to which the human eye is more sensitive and the low-grade photoresist for forming the blue color filters and the red color filters to which the human eye is less sensitive. It should be noted that the high-grade photoresist and the low-grade photoresist of the present invention are photoresists differed by at least one grade. Accordingly, the green color filters which require high color accuracy is formed on the substrate by the high-grade photoresist and serve as the framework for forming the Bayer pattern CFA. Subsequently, the blue color filters and the red color filters including the low-grade photoresist are provided to fill the gaps in the framework. Thus the Bayer pattern CFA having photoresists of hybrid grades is obtained. Because the high-grade photoresist provides higher resolution, it is conventionally adopted to form the R/G/B color filters in the smaller pixel design for high-grade devices. However, according to the CFA having hybrid color filters and manufacturing method provided by the present invention, the red color filters and the blue color filters of the high-grade devices are now formed by the low-grade photoresist, thus the cost is economized. Accordingly, the CFA performance is improved without increasing process cost.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for manufacturing a color filter array (CFA), comprising:
   providing a high-grade photoresist and a low-grade photoresist;
   forming a plurality of first color filters on a substrate, the first color filters comprising the high-grade photoresist; and the high-grade photoresist of the first color comprising a first amount of large size pigments in one unit area; and
   forming a plurality of second color filters and a plurality of third color filters on the substrate after forming the first color filters, the second color filters and the third color filters comprising the low-grade photoresist, and the low-grade photoresists of the second color and the third color comprising a second amount of large size pigments in one unit area; wherein a ratio of the second amount to the first amount is equal to or larger than 1.

2. The method for manufacturing the CFA according to claim 1, wherein the high-grade photoresist comprises a green color, and the first color filters are green color filters.

3. The method for manufacturing the CFA according to claim 2, wherein the high-grade photoresist further comprises a blue color and a red color.

4. The method for manufacturing the CFA according to claim 3, wherein the high-grade photoresists of the blue color and the red color comprise a third amount of large size pigments in one unit area.

5. The method for manufacturing the CFA according to claim 4, wherein a ratio of the third amount to the first amount is smaller than 1.

6. The method for manufacturing the CFA according to claim 1, wherein the low-grade photoresist comprises a blue color and a red color, and the second color filters are blue color filters and the third color filters are red color filters.

7. The method for manufacturing the CFA according to claim 6, wherein the low-grade photoresist further comprises a green color.

8. The method for manufacturing the CFA according to claim 7, wherein the low-grade photoresist of the green color comprises a fourth amount of large size pigments in one unit area.

9. The method for manufacturing the CFA according to claim 8, wherein a ratio of the second amount to the fourth amount is smaller than 1.

10. The method for manufacturing the CFA according to claim 1, wherein the first color filters, the second color filters, and the third color filters are arranged to form a Bayer pattern CFA.

11. The method for manufacturing the CFA according to claim 10, wherein the green color filters in the Bayer pattern CFA comprises a checker board pattern, the checker board pattern comprises a plurality of rows, and each row comprises a plurality of gaps.

12. The method for manufacturing the CFA according to claim 11, wherein the second color filters and the third color filters are respectively positioned in the gaps in adjacent rows.

13. A color filter array (CFA) having hybrid color filters comprising:
- a plurality of green color filters having a high-grade photoresist;
- a plurality of blue color filters having a low-grade photoresist; and
- a plurality of red color filters having the low-grade photoresist; wherein
- the high-grade photoresist comprises a first amount of large size pigments in one unit area, the low-grade photoresist comprises a second amount of large size pigments in one unit area, and a ratio of the second amount to the first amount is equal to or larger than 1.

14. The CFA having the hybrid color filters according to claim 13, wherein the high-grade photoresist further comprises a blue color and a red color.

15. The CFA having the hybrid color filters according to claim 14, wherein the high-grade photoresists of the blue color and the red color comprise a third amount of large size pigments in one unit area.

16. The CFA having the hybrid color filters according to claim 15, wherein ratio of the third amount to the first amount is smaller than 1.

17. The CFA having the hybrid color filters according to claim 13, wherein the low-grade photoresist further comprises a green color.

18. The CFA having the hybrid color filters according to claim 17, wherein the low-grade photoresist of the green color comprises a fourth amount of large size pigments in one unit area.

19. The CFA having the hybrid color filters according to claim 18, wherein a ratio of the fourth amount to the second amount is smaller than 1.

20. The CFA having the hybrid color filters according to claim 13, wherein the green color filters, the blue color filters, and the red color filters are arranged to form a Bayer pattern CFA.

* * * * *